United States Patent [19]

Suzuki et al.

[11] Patent Number: 5,037,502
[45] Date of Patent: Aug. 6, 1991

[54] PROCESS FOR PRODUCING A SINGLE-CRYSTAL SUBSTRATE OF SILICON CARBIDE

[75] Inventors: Akira Suzuki, Nara; Katsuki Furukawa, Osaka, both of Japan

[73] Assignee: Sharp Kabushiki Kaisha, Osaka, Japan

[21] Appl. No.: 683,651

[22] Filed: Dec. 19, 1984

[30] Foreign Application Priority Data

Dec. 29, 1983 [JP] Japan ............................ 58-246512

[51] Int. Cl.[5] .................................... C30B 25/00
[52] U.S. Cl. ................................ 156/610; 156/613; 437/243; 65/18.2
[58] Field of Search ............... 65/3.12, 18.2; 156/610, 156/613; 501/88; 427/95; 437/243

[56] References Cited

U.S. PATENT DOCUMENTS

| | | | |
|---|---|---|---|
| 3,956,032 | 5/1976 | Powell et al. | 156/610 |
| 3,960,619 | 6/1976 | Seiter | 156/613 |
| 4,455,385 | 6/1984 | Prochazka | 501/88 |
| 4,512,825 | 4/1985 | Addamiano et al. | 156/610 |
| 4,623,425 | 11/1986 | Suzuki et al. | 156/613 |

FOREIGN PATENT DOCUMENTS

| | | | |
|---|---|---|---|
| 2324287 | 3/1983 | Fed. Rep. of Germany | 156/610 |
| 55-116700 | 9/1980 | Japan | 156/610 |

Primary Examiner—Kenneth M. Schor
Attorney, Agent, or Firm—Spencer & Frank

[57] ABSTRACT

A process for producing a single-crystal substrate of silicon carbide comprises growing a single-crystal film of α-silicon carbide on a single-crystal film of β-silicon carbide as a growth substrate, thereby obtaining a high quality single-crystal substrate of α-silicon carbide having a large area, which is producible on a commercial scale.

15 Claims, 2 Drawing Sheets

PROCESS FOR PRODUCING A SINGLE-CRYSTAL SUBSTRATE OF SILICON CARBIDE

BACKGROUND OF THE INVENTION

1. Field of the invention:

The present invention relates to a process for producing a single-crystal substrate of α-silicon carbide (SiC).

2. Description of the prior art

Silicon carbide is a semiconductor material, which has a wide forbidden energy gap of 2.2 to 3.3 electron-volts (eV) and is thermally, chemically and mechanically stable and also has a great resistance to radiation damage Both p-type and n-type silicon carbides have good stability, which is rare for wide-gap semiconductors, making it useful as a semiconductor material for optoelectronic devices utilizing visible light of short wavelengths, for electronic devices operable at high temperatures or with great electric power, for highly reliable semiconductor devices, for radiation-resistant devices, etc., and usable in an environment where difficulties are encountered with devices made of conventional semiconductor materials, thereby greatly enlarging the range of applications for semiconductor devices. Whereas other wide-gap semiconductor materials such as semiconductors made of II-VI groups, III-V groups, etc., generally contain a heavy metal as a main component therein and thus entail problems of pollution and availability of raw materials, silicon carbide is free of these problems.

Silicon carbide has many varient structures (i.e., polytype structures), which are classified into two types, and α- and β-silicon carbides. α-silicon carbide has a hexagonal or rhombohedral crystal structure having a forbidden energy gap of as wide as 2.9 to 3.3 eV, while β-silicon carbide has a cubic crystal structure having an energy gap of as narrow as 2.2 eV. Therefore, α-silicon carbide is a semiconductor material which can be used as optoelectronic devices such as light emitting devices, photo detectors, etc., for visible light of short wavelengths including blue and near-ultraviolet light. As conventional semiconductor materials which are usable as light emitting devices for visible light of short wavelengths including blue, zinc sulfide (ZnS), zinc selenide (ZnSe), gallium nitride (GaN), etc., have been used. However, crystals having either p-type or n-type conductivity can be obtained therefrom. On the contrary, α-silicon carbide allows the production of a crystal having both p-type and n-type conductivities thereby enabling the formation of a p-n junction structure, so that light emitting devices and photo detectors having excellent optical and electrical characteristics can be produced. Moreover, α-silicon carbide is so stable thermally, chemically and mechanically that it can make possible an enlarged range of applications for semiconductor devices as compared with other semiconductor materials.

Despite these many advantages and capabilities, silicon carbide (including α-types and β-types) has not yet been placed in actual use because the technique for growing silicon carbide crystals with good reproducibility which is required for commercially producing high quality silicon carbide substrates having a large surface area has yet to be developed.

Conventional processes for preparing single-crystal substrates of silicon carbide on a laboratory scale include the so-called sublimation method (i.e., the Lely method) wherein silicon carbide powder is sublimed in a graphite crucible at 2,200° C. to 2,600° C. and recrystallized to obtain a silicon carbide substrate, the so-called solution method wherein silicon or a mixture of silicon with impurities such as iron, cobalt, platinum or the like is melted in a graphite crucible to obtain a silicon carbide substrate, and the Acheson method which is generally used for commercially producing abrasives and by which silicon carbide substrates are obtained incidentally. On the α-silicon carbide substrates prepared by these crystal growth methods, a single-crystal layer of α-silicon carbide is epitaxially grown by the liquid phase epitaxial (LPE) technique and/or the chemical vapor deposition (CVD) technique to form a p-n junction, resulting in blue emitting diodes.

Although a large number of crystals can be obtained by either the sublimation method or the solution method, it is difficult to prepare large single-crystal substrates of silicon carbide since many crystal nuclei occur at the initial stage of crystal growth. Silicon carbide substrates incidentally obtained by the Acheson method are so inferior in purity and crystallinity that they cannot be used as semiconductor materials. Even though large single-crystal substrates are obtained, they are only incidental and therefore, insignificant to commercial production of silicon carbide substrates. Thus, according to these conventional processes for the production of single-crystal substrates of silicon carbide, it is difficult to control the size, shape and quality, of single-crystal substrates of silicon carbide on an industrial scale. Although on the α-silicon carbide substrates obtained by the above-mentioned crystal growth methods, light emitting diodes can be produced by the liquid phase epitaxial technique or the chemical vapor deposition technique as mentioned above, no process for commercially producing high quality α-type single-crystal substrates having a large surface area is known so that it is impossible to produce industrially the α-type single-crystal substrates in large quantities.

In recent years, the inventors have completed a process for growing large-sized single-crystals of β-type silicon carbide of good quality on a single-crystal substrate of silicon by the chemical vapor deposition technique and filed a Japanese Patent Application No. 58-76842 (76842/1983) which corresponds to U.S. Pat. application Ser. No. 603,454. This process includes growing a thin film of silicon carbide on a silicon substrate by the CVD method at a low temperature and then growing a single-crystal film of silicon carbide on the said thin film by the CVD method at a higher temperature, thereby allowing the production of large-sized single-crystal substrates of β-silicon carbide having a high quality on a single-crystal substrate of silicon which is available at low cost, while controlling the polytype, the concentration of impurities, the electrical conductivity, the size, the shape or the like of single-crystals.

SUMMARY OF THE INVENTION

The process of this invention which overcomes the above-discussed and numerous other disadvantages and deficiencies of the prior art, comprises growing a single-crystal film of α-silicon carbide on a single-crystal film of β-silicon carbide as a growth substrate.

The growth substrate is, in a preferred embodiment, heated at a temperature in the range of 1,400° C. to 1,900° C.

A mixture of monosilane gas and propane gas is, in a preferred embodiment, supplied as a source gas to the surface of said growth substrate with hydrogen gas as a carrier gas.

The single-crystal film of β-silicon carbide is, in a preferred embodiment, produced by covering the surface of a silicon substrate with a uniform thin film of β-silicon silicon carbide grown in accordance with the CVD method at a low temperature, and thereafter growing a single-crystal film of β-silicon carbide on the thin film in accordance with the CVD method at a higher temperature than in the preceding step.

Thus, the invention described herein makes possible the objects of (1) providing a process for producing a high quality single-crystal substrate of α-silicon carbide having a large surface area, and being producible on a commercial scale; (2) providing a practical approach to stably supply the said single-crystal substrate of α-silicon carbide as optoelectronic device materials for light emitting devices, photo detectors, etc., for visible light of short wavelengths including blue and near-ultraviolet light; and (3) providing the possibility of an enlarged range of applications of the said single-crystal to semiconductor devices by utilizing the thermal, chemical and mechanical stability of the said single-crystal.

BRIEF DESCRIPTION OF THE DRAWINGS

This invention may be better understood and its numerous objects and advantages will become apparent to those skilled in the art by reference to the accompanying drawing as follows.

DESCRIPTION OF THE PREFERRED EMBODIMENTS

In general, the crystal quality of the epitaxially grown layer which results from a heteroepitaxial growth (namely, a semiconductor crystal is grown on a foreign single-crystal substrate by an epitaxial technique) deteriorates to the difference in size between the crystal lattices thereof, i.e., lattice mismatch. The size of the crystal lattice exhibits the interatomic distances of each atom.

Although β-silicon carbide is different from α-silicon carbide in crystal structure, crystal lattice is almost the same size as α-silicon carbide so that the quality of a single-crystal of α-silicon carbide grown on a single-crystal substrate of β-silicon carbide does not deteriorate. In addition, the β-silicon carbide substrate consists of the same atoms as the growth layer of α-silicon carbide, so the growth layer is not contaminated with impurities from the substrate thereby obtaining a single-crystal film of α-silicon carbide having a good quality and parity.

Figure 1:
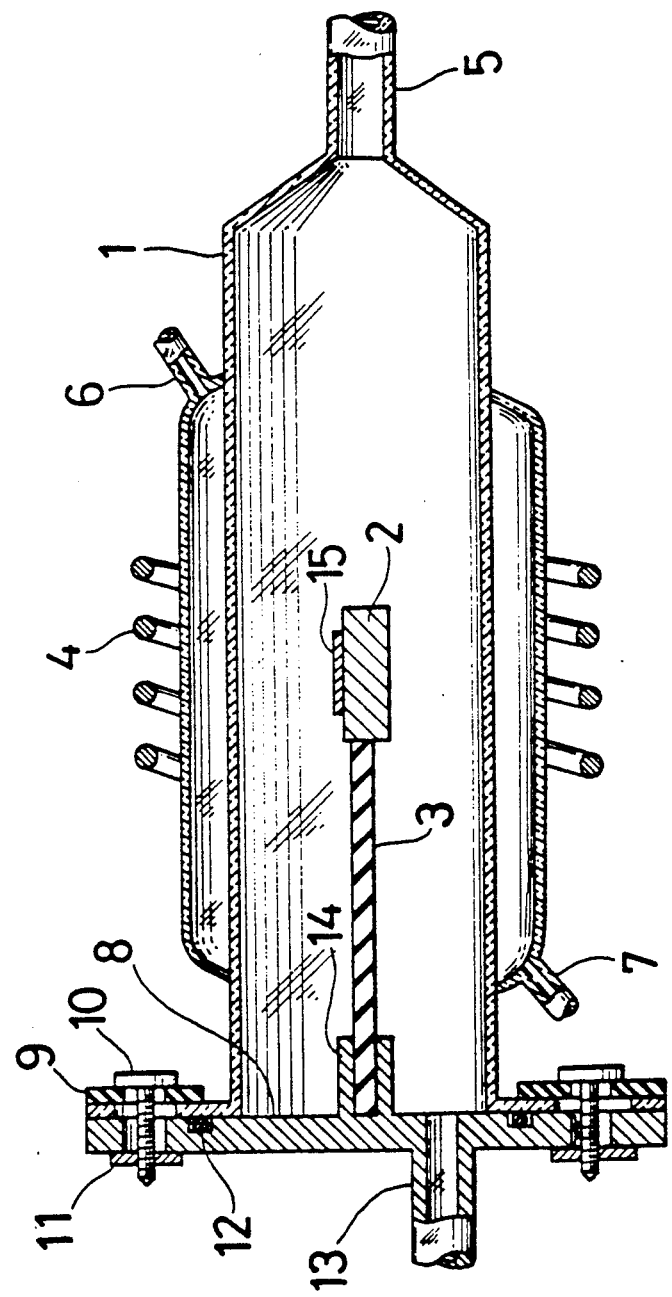
FIG. 1 is a sectional side view of a growth apparatus for growing an α-SiC single-crystal film on a β-SiC single-crystal substrate according to this invention.

FIG. 1 shows a growth apparatus used for the growth of a single-crystal film of α-silicon carbide on a single-crystal substrate of β-silicon carbide according to this invention. The apparatus comprises a water-cooled horizontal quartz double reactor tube 1 which is internally provided with a graphite susceptor supported by a graphite support bar 3. The reactor tube 1 is wound with a working coil 4, through which a radio-frequency current is passed to heat the susceptor 2 by induction. The susceptor 2 may be positioned horizontally or is suitably inclined. The reactor tube 1 has at its one end a branch tube 5 providing a gas inlet. Through branch tubes 6, 7, cooling water is supplied to the interior of the outer tube of the reactor tube 1. The other end of the reactor tube 1 is sealed by a stainless steel flange 8, a holding plate 9, bolts 10, nuts 11 and an O-ring 12. The flange 8 has a branch tube 13 providing a gas outlet. A fixing portion 14 in the flange 8 fixes the graphite bar 3. A single-crystal substrate 15 of β-silicon carbide having a thickness of about 30 μm and a surface area of 1 cm × 1 cm is placed on the susceptor 2. Crystals are grown in the following manner using this apparatus:

The air within the reactor tube 1 is replaced by hydrogen gas, and a radio-frequency current is passed through the working coil 4 to heat the graphite sample table 2 and raise the temperature of the β-silicon carbide substrate 15 up to 1,400° C.–1,900° C., preferably 1,500° C.–1,700° C. As a source gas, monosilane ($SiH_4$) is fed to the reactor tube 1 at a rate of 0.1–0.4 cm$^3$/min. and propane ($C_3H_8$) at 0.1–0.4 cm$^3$/min. Hydrogen is fed to the reactor tube 1 at a rate of 1–5/min. as a carrier gas. These gases are fed through the branch tube 5 to the reactor tube 1 for 1 hour. A single-crystal film of α-silicon carbide having a thickness of about 2 μm is formed over the entire surface of the β-silicon carbide substrate. The single-crystal of β-silicon carbide as a growth substrate for the single-crystal film of α-silicon carbide may be removed, if desired, by an etching technique, etc. to use the remaining single-crystal of α-silicon carbide as a semiconductor material.

The β-SiC single-crystal substrate to be used as a growth substrate for the α-SiC single-crystal can be formed, as disclosed in U.S. Pat. application Ser. No. 603,454 filed in the name of Sharp Kabushiki Kaisha on Apr. 24, 1984, by covering the surface of a silicon substrate with a uniform thin film of silicon carbide grown in accordance with the CVD method at a low temperature, and thereafter growing a single-crystal film of β-silicon carbide on the thin film in accordance with the CVD method at a higher temperature than in the preceding step.

The terminology "low temperature" herein used means a temperature which is lower than the temperature for growing a β-SiC single-crystal and at which a thin SiC film can be formed. More specifically, the low temperature is in the range of 800° C. to 1,200° C., preferably 1,000° C. to 1,100° C., at atmospheric pressure, while the temperature for growing the β-SiC single crystal is 1,200° C. to 1,400° C., preferably 1,300° C. to 1,350° C., at atmospheric pressure.

The CVD method is conducted by supplying a mixture of silicon gas and carbon gas as a source gas to the surface of a silicon substrate. The gas mixture is composed of a silicon source (such as $SiH_4$, $SiCl_4$, $SiH_2Cl_2$, $(CH_3)_3SiCl$ or $(CH_3)_2SiCl_2$) and a carbon source (such as $CCl_4$, $CH_4$, $C_3H_8$ or $C_2H_6$). A carrier gas such as hydrogen or argon may be used. For the low-temperature CVD method, the gas mixture is usually fed at a rate of 0.01 to 10 c.c/min., preferably 0.05 to 5 c.c./min.. The mixing ratio of the silicon source to the carbon source is generally 0.01 to 10, preferably 0.5 to 5, in terms of the Si/C atomic number ratio. The time taken for the formation of the thin film is 0.5 to 10 minutes, preferably 1 to 5 minutes. The thickness of the thin film is about 10 to 1,000 Å, preferably about 100 to about 500 Å, which can be controlled primarily by adjusting the supply of the gas mixture and the film forming time.

Subsequently a single-crystal film of β-SiC is formed on the thin SiC film by the CVD method at an elevated growth temperature of 1,200° C. to 1,400° C. at atmospheric pressure. The β-SiC single-crystal film is suitably 1 to 50 μm, practically 0.5 to 5 μm or 10 to 50 μm, in thickness. A film of such thickness can be obtained generally by supplying the gas mixture at a rate of 0.01 to 10 c.c./min., preferably 0.05 to 5 c.c./min., in a mixing ratio (Si/C atomic number ratio) of 0.01 to 10, preferably 0.5 to 5, for 0.5 to 15 hours (growing time).

Figure 2:
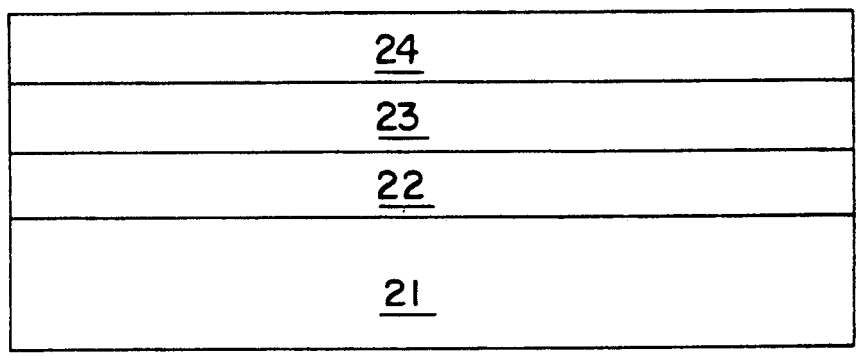
FIG. 2 is a representation of a side view of a composite according to the process of the invention.

FIG. 2 is a representation of a side view of a composite according to the process of the invention. A silicon substrate 21 is covered with a uniform thin film of β-silicon carbide 22 deposited by chemical vapor deposition at a temperature too low to grow single-crystal β-silicon carbide. That is, the first film of β-silicon carbide 22 covering the silicon substrate is not single-crystal β-silicon carbide. Another film, of single-crystal β-silicon carbide 23 then covers the first film. Finally, a single-crystal film of α-silicon carbide 24 may be grown on the single-crystal film of β-silicon carbide 23.

Prior to the use of the resulting β-SiC single-crystal film as a growth substrate for the α-SiC single-crystal, the silicon substrate covered with the said β-SiC single-crystal film is, of course, removed using an acid, etc.

Either the β-SiC substrate or the α-SiC film can be produced by liquid phase epitaxy, the sublimation method, the deposition method, molecular beam epitaxy, the spattering method or the like, in addition to the CVD method.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A process for producing a single-crystal substrate of silicon carbide comprising growing a single-crystal film of α-silicon carbide on a single-crystal film of β-silicon carbide as a growth substrate.

2. A process according to claim 1, wherein said growth substrate is heated at a temperature in the range of 1,400° C. to 1,900° C.

3. A process according to claim 1, wherein a mixture of monosilane gas and propane gas is supplied as a source gas to the surface of said growth substrate with hydrogen gas as a carrier gas.

4. A process of producing a single-crystal substrate of silicon carbide comprising steps for:
producing a single-crystal film of β-silicon carbide as a growth substrate by (1) covering the surface of a silicon substrate with a uniform thin film of β-silicon carbide grown by chemical vapor deposition at a temperature lower than the temperature for growing a β-silicon carbide single crystal, and (2) growing a single-crystal film of β-silicon carbide on the thin film by chemical vapor deposition at a higher temperature than in the preceding step, and
growing a single-crystal film of α-silicon carbide on said single-crystal film of β-silicon carbide as a growth substrate.

5. A process according to claim 4, wherein said low temperature is in the range of 800° C. to 1,200° C. and said higher temperature is in the range of 1,200° C. to 1,400° C., at atmospheric pressure.

6. A process according to claim 4, wherein said low temperature is in the range of 1,000° C. to 1,100° C. and said higher temperature is in the range of 1,300° C. to 1,350° C., at atmospheric pressure.

7. A process according to claim 4, wherein each of the two steps by the CVD method is conducted by supplying a mixture of silicon gas and carbon gas to the surface of the silicon substrate.

8. A process according to claim 7, wherein said silicon gas is one selected from the groups consisting of gases of $SiH_4$, $SiCl_4$, $SiH_2Cl_2$, $(CH_3)_3SiCl$ and $(CH_3)_2SiCl_2$, and said carbon gas is one selected from the groups consisting of gases of $CCl_4$, $CH_4$, $C_3H_8$ and $C_2H_6$.

9. A process according to claim 7, wherein the mixing ratio of the mixture of the silicon gas and the carbon gas is 0.01 to 10 as the Si/C atomic number ratio.

10. A process according to claim 7, wherein said mixing ratio is in the range of 0.5 to 5.

11. A process according to claim 4, wherein said thin film of silicon carbide grown by the CVD method at a low temperature has a thickness in the range of 10 to 1,000 Å.

12. A process according to claim 4, wherein said thin film has a thickness in the range of 100 to 500 Å.

13. A process according to claim 4, wherein said single-crystal film of β-silicon carbide on the thin film has a thickness in the range of 0.1 to 50 μm.

14. A process according to claim 4, wherein said single-crystal film of β-silicon carbide has a thickness in the range of 0.5 to 5 μm or 10 to 50 μm.

15. A process according to claim 4, wherein each of the two steps by the CVD method is conducted by supplying a mixture of silicon gas, carbon gas, and a carrier gas to the surface of the silicon substrate.

* * * * *